(12) United States Patent
Chen et al.

(10) Patent No.: US 12,394,472 B2
(45) Date of Patent: Aug. 19, 2025

(54) MEMORY DEVICE AND METHOD FOR OPERATING THE SAME

(71) Applicant: NANYA TECHNOLOGY CORPORATION, New Taipei (TW)

(72) Inventors: Chien Yu Chen, New Taipei (TW); Po-Jen Yang, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 135 days.

(21) Appl. No.: 18/396,210

(22) Filed: Dec. 26, 2023

(65) Prior Publication Data

US 2025/0210097 A1    Jun. 26, 2025

(51) Int. Cl.
*G11C 11/4093*     (2006.01)
*G11C 17/16*     (2006.01)
*H03K 19/00*     (2006.01)

(52) U.S. Cl.
CPC .......... *G11C 11/4093* (2013.01); *G11C 17/16* (2013.01); *H03K 19/0005* (2013.01)

(58) Field of Classification Search
CPC .. G11C 11/4093; G11C 17/16; H03K 19/0005
See application file for complete search history.

(56) References Cited

U.S. PATENT DOCUMENTS

| | | | |
|---|---|---|---|
| 9,786,363 B1* | 10/2017 | Hong | G11C 11/419 |
| 2008/0048714 A1* | 2/2008 | Lee | H03K 19/0005 |
| | | | 326/30 |
| 2009/0146683 A1* | 6/2009 | Kim | H03K 19/0005 |
| | | | 326/30 |
| 2009/0322375 A1* | 12/2009 | Choi | H01C 1/16 |
| | | | 338/334 |
| 2011/0102057 A1* | 5/2011 | Jurasek | G05F 1/567 |
| | | | 327/512 |
| 2012/0256654 A1* | 10/2012 | Cho | H03K 19/017581 |
| | | | 326/30 |
| 2017/0069369 A1* | 3/2017 | Kim | G11C 7/1084 |
| 2024/0127866 A1* | 4/2024 | Yang | G05F 1/465 |

\* cited by examiner

*Primary Examiner* — Khamdan N. Alrobaie
(74) *Attorney, Agent, or Firm* — CKC & Partners Co., LLC

(57) ABSTRACT

A memory device includes a memory circuit, a redistribution layer and a resistor circuit. The redistribution layer is coupled to the memory circuit. The resistor circuit is coupled to the memory circuit. The resistor circuit includes a first resistor set and a second resistor set. The first resistor set includes a first resistor and a second resistor. The second resistor set includes a third resistor and a fourth resistor. After the first resistor and the second resistor are coupled in parallel and the third resistor and the fourth resistor are coupled in parallel according to an impedance value of the redistribution layer, the first resistor set and the second resistor set are coupled in parallel according to an impedance value of the memory circuit.

20 Claims, 6 Drawing Sheets

MEMORY DEVICE AND METHOD FOR OPERATING THE SAME

BACKGROUND

Technical Field

The present disclosure relates to a memory technology. More particularly, the present disclosure relates to a memory device and a method for operating the memory device.

Description of Related Art

In order to apply integrated circuits (ICs) to various component modules, redistribution layers (RDLs) are coupled to/formed in the ICs to change contact locations of the ICs, such that the contact locations match the various component modules. However, additional lines of RDLs increase impedance of the ICs, such as a DRAM, thereby affecting signal integrity (SI) of signals written into the DRAM. Thus, techniques associated with the development for overcoming the problems described above are important issues in the field.

SUMMARY

The present disclosure provides a memory device. The memory device includes a memory circuit, a redistribution layer and a resistor circuit. The redistribution layer is coupled to the memory circuit. The resistor circuit is coupled to the memory circuit. The resistor circuit includes a first resistor set and a second resistor set. The first resistor set includes a first resistor and a second resistor. The second resistor set includes a third resistor and a fourth resistor. After the first resistor and the second resistor are coupled in parallel and the third resistor and the fourth resistor are coupled in parallel according to an impedance value of the redistribution layer, the first resistor set and the second resistor set are coupled in parallel according to an impedance value of the memory circuit.

The present disclosure also provides a memory device. The memory device includes a memory circuit, a redistribution layer and a resistor circuit. The redistribution layer is coupled to the memory circuit. The resistor circuit is coupled to the memory circuit. The resistor circuit includes a first resistor set and a second resistor set. The first resistor set includes a first resistor, a second resistor and a first fuse coupled to the second resistor. The second resistor set includes a third resistor, a fourth resistor and a second fuse coupled to the fourth resistor. After the first resistor and the second resistor are coupled in parallel through the first fuse and the third resistor and the fourth resistor are coupled in parallel through the second fuse according to an impedance value of the redistribution layer, the first resistor set and the second resistor set are coupled in parallel according to an impedance value of the memory circuit.

The present disclosure also provides a method for operating a memory device. The method includes: coupling a resistor circuit to a memory circuit; coupling a redistribution layer to the memory circuit; coupling a first resistor and a second resistor in parallel according to an impedance value of the redistribution layer; coupling a third resistor and a fourth resistor in parallel according to the impedance value of the redistribution layer; and after the first resistor and the second resistor are coupled in parallel and the third resistor and the fourth resistor are coupled in parallel, coupling a first resistor set and a second resistor set in parallel according to an impedance value of the memory circuit.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
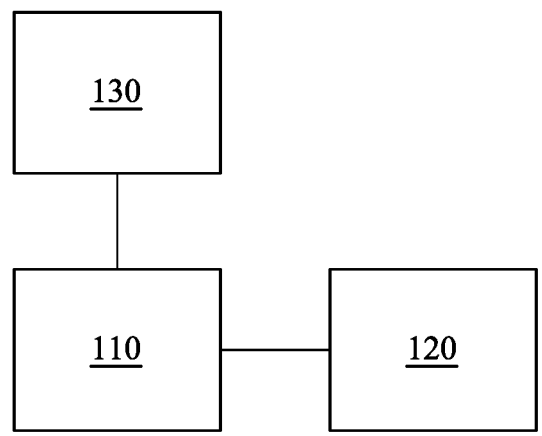
FIG. 1 is a schematic diagram of a memory device illustrated according to some embodiments of this disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above", "upper", "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a schematic diagram of a memory device 100 illustrated according to some embodiments of this disclosure. As illustratively shown in FIG. 1, the memory device 100 includes a memory circuit 110, a resistor circuit 120, and a redistribution layer 130. The memory circuit 110 is coupled to the resistor circuit 120 and the redistribution layer 130.

In some embodiments, the memory device 100 has an impedance RM with an impedance value ZM (not shown). The resistor circuit 120 has an impedance RR with an impedance value ZR (not shown). The redistribution layer 130 has an impedance RL with an impedance value ZL (not shown). In some embodiments, the impedance value ZM is equal to the sum of the impedance value ZL and the impedance value ZR. In some embodiments, the impedance value ZM is equal to the impedance value ZR without the redistribution layer 130 in the memory device 100. In some embodiments, the impedance value ZR corresponds to the impedance value of the memory circuit 110.

In some embodiments, the memory circuit 110 is implemented as a Dynamic Random Access Memory (DRAM) or a die. In some embodiments, the resistor circuit 120 is configured to adjust the impedance of the input/output (I/O) of the memory circuit 110 according to various operations of the memory circuit 110 and the impedance value ZM of the memory device 100. In some embodiments, the redistribution layer 130 is configured to make I/O pads of the memory circuit 110 available in other locations.

Figure 2:
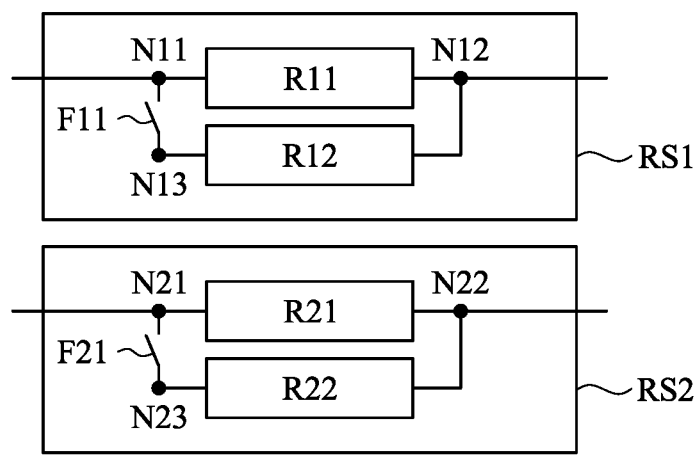
FIG. 2 is a schematic diagram of a resistor circuit illustrated according to some embodiments of this disclosure.

FIG. 2 is a schematic diagram of a resistor circuit 200 illustrated according to some embodiments of this disclosure. As illustratively shown in FIG. 2, the resistor circuit 200 includes a resistor set RS1 and a resistor set RS2.

As illustratively shown in FIG. 2, the resistor set RS1 includes a fuse F11, a resistor R11 and a resistor R12. The resistor set RS2 includes a fuse F21, a resistor R21 and a resistor R22. A terminal of the resistor R11 is coupled to the node N11, another terminal of the resistor R11 is coupled to the node N12. A terminal of the resistor R12 is coupled to the node N13, another terminal of the resistor R12 is coupled to the node N12. A terminal of the fuse F11 is coupled to the node N13. A terminal of the resistor R21 is coupled to the node N21, another terminal of the resistor R21 is coupled to the node N22. A terminal of the resistor R22 is coupled to the node N23, another terminal of the resistor R22 is coupled to the node N22. A terminal of the fuse F21 is coupled to the node N23.

In some embodiments, the resistor sets RS1 and RS2 are coupled in parallel through coupling the nodes N11 and N21 and coupling the nodes N12 and N22. The resistors R11 and R12 are coupled in parallel through coupling the nodes N11 and another terminal of the fuse F11. The resistors R21 and R22 are coupled in parallel through coupling the nodes N21 and another terminal of the fuse F21.

Referring to FIG. 1 and FIG. 2, the resistor circuit 200 is an embodiment of the resistor circuit 120. The resistor circuit 200 is coupled to the memory circuit 110 through the node N11. In some embodiments, the resistor set RS1 is configured to receive a power supply voltage VDDQ (not shown) through the node N12. In some embodiments, the resistor sets RS1 and RS2 are coupled in parallel according to various operations of the memory circuit 110. In some embodiments, the resistors R11 and R12 are coupled in parallel and the resistors R21 and R22 are coupled in parallel according to the impedance value ZL of the impedance RL in the redistribution layer 130.

In some embodiments, the resistor circuit 200 includes different number of resistor sets, wherein each of the resistor sets have the configuration similar to the configuration illustrated in FIG. 2. For example, the resistor circuit 200 includes resistor sets RS1-RSn, wherein n is an integer more than 1. In some embodiments, n is 7 in DRAM configurations.

In some embodiments, each of the resistor sets RS1-RSn in the resistor circuit 200 includes different number of resistors and fuses, wherein each of the resistors and fuses have the configuration similar to the configuration illustrated in FIG. 2. For example, the number of resistors in each of the resistor sets RS1-RSn is m, wherein m is an integer more than 1. Correspondingly, the number of fuses in each of the resistor sets RS1-RSn is m−1.

Figure 3:
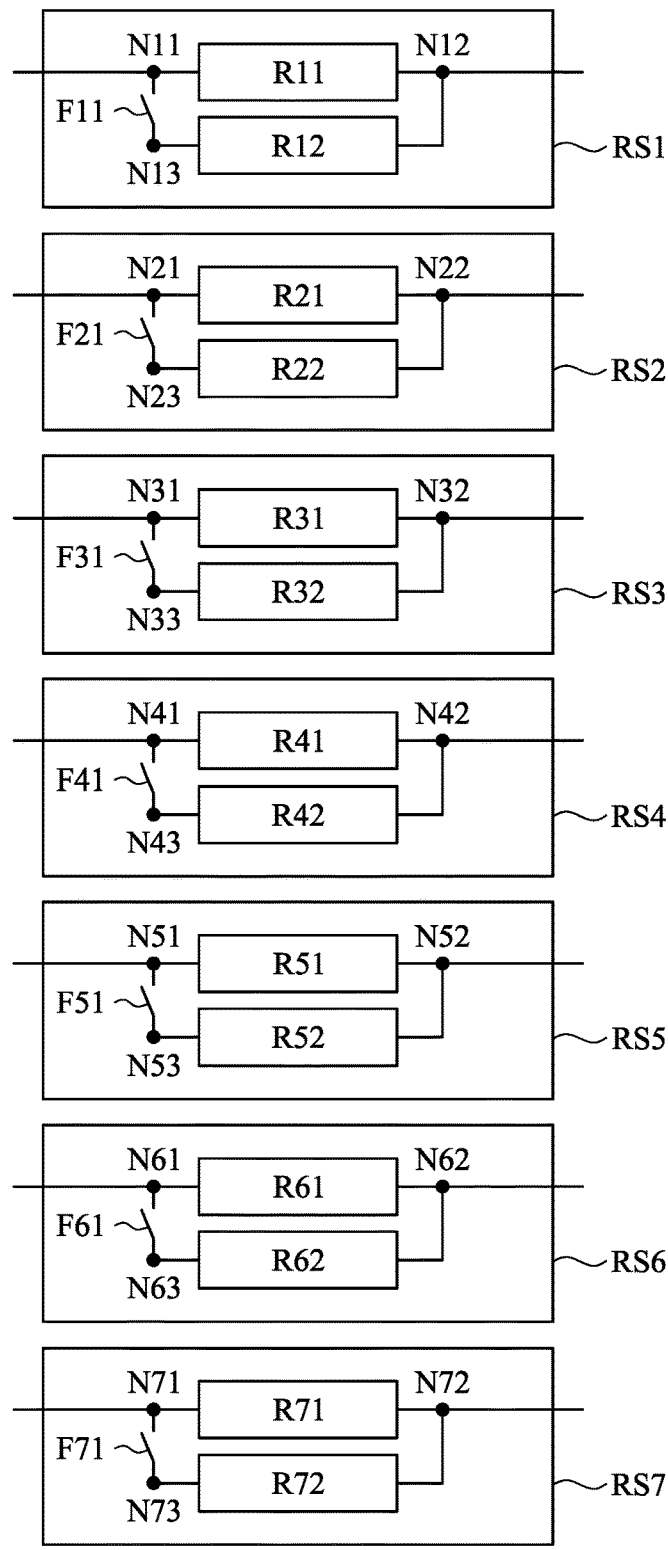
FIG. 3 is a schematic diagram of a resistor circuit illustrated according to some embodiments of this disclosure.

FIG. 3 is a schematic diagram of a resistor circuit 300 illustrated according to some embodiments of this disclosure. Compared with the resistor circuit 200 in FIG. 2, the resistor circuit 300 in FIG. 3 further includes resistor sets RS3-RS7.

As illustratively shown in FIG. 3, the resistor set RS3 includes a fuse F31, a resistor R31 and a resistor R32. The resistor set RS4 includes a fuse F41, a resistor R41 and a resistor R42. The resistor set RS5 includes a fuse F51, a resistor R51 and a resistor R52. The resistor set RS6 includes a fuse F61, a resistor R61 and a resistor R62. The resistor set RS7 includes a fuse F71, a resistor R71 and a resistor R72. A terminal of the resistor R31 is coupled to the node N31, another terminal of the resistor R31 is coupled to the node N32. A terminal of the resistor R32 is coupled to the node N33, another terminal of the resistor R32 is coupled to the node N32. A terminal of the fuse F31 is coupled to the node N33. A terminal of the resistor R41 is coupled to the node N41, another terminal of the resistor R41 is coupled to the node N42. A terminal of the resistor R42 is coupled to the node N43, another terminal of the resistor R42 is coupled to the node N42. A terminal of the fuse F41 is coupled to the node N43. A terminal of the resistor R51 is coupled to the node N51, another terminal of the resistor R51 is coupled to the node N52. A terminal of the resistor R52 is coupled to the node N53, another terminal of the resistor R52 is coupled to the node N52. A terminal of the fuse F51 is coupled to the node N53. A terminal of the resistor R61 is coupled to the node N61, another terminal of the resistor R61 is coupled to the node N62. A terminal of the resistor R62 is coupled to the node N63, another terminal of the resistor R62 is coupled to the node N62. A terminal of the fuse F61 is coupled to the node N63. A terminal of the resistor R71 is coupled to the node N71, another terminal of the resistor R71 is coupled to the node N72. A terminal of the resistor R72 is coupled to the node N73, another terminal of the resistor R72 is coupled to the node N72. A terminal of the fuse F71 is coupled to the node N73.

In some embodiments, the resistor sets RS1 and RS3 are coupled in parallel through coupling the nodes N11 and N31 and coupling the nodes N12 and N32. The resistor sets RS1 and RS4 are coupled in parallel through coupling the nodes N11 and N41 and coupling the nodes N12 and N42. The resistor sets RS1 and RS5 are coupled in parallel through coupling the nodes N11 and N51 and coupling the nodes N12 and N52. The resistor sets RS1 and RS6 are coupled in parallel through coupling the nodes N11 and N61 and coupling the nodes N12 and N62. The resistor sets RS1 and RS7 are coupled in parallel through coupling the nodes N11 and N71 and coupling the nodes N12 and N72.

In some embodiments, the resistors R31 and R32 are coupled in parallel through coupling the node N31 and another terminal of the fuse F31. The resistors R41 and R42 are coupled in parallel through coupling the node N41 and another terminal of the fuse F41. The resistors R51 and R52 are coupled in parallel through coupling the node N51 and another terminal of the fuse F51. The resistors R61 and R62 are coupled in parallel through coupling the node N61 and another terminal of the fuse F61. The resistors R71 and R72 are coupled in parallel through coupling the node N71 and another terminal of the fuse F71.

Referring to FIG. 1 to FIG. 3, the resistor circuit 300 is an embodiment of the resistor circuit 200. In some embodiments, some or all of the resistor sets RS1-RS7 are coupled in parallel according to various operations of the memory circuit 110. In some embodiments, some or all of the resistors R11-R71 and R12-R72 are coupled in parallel respectively according to the impedance value ZL of the impedance RL in the redistribution layer 130.

Figure 4:
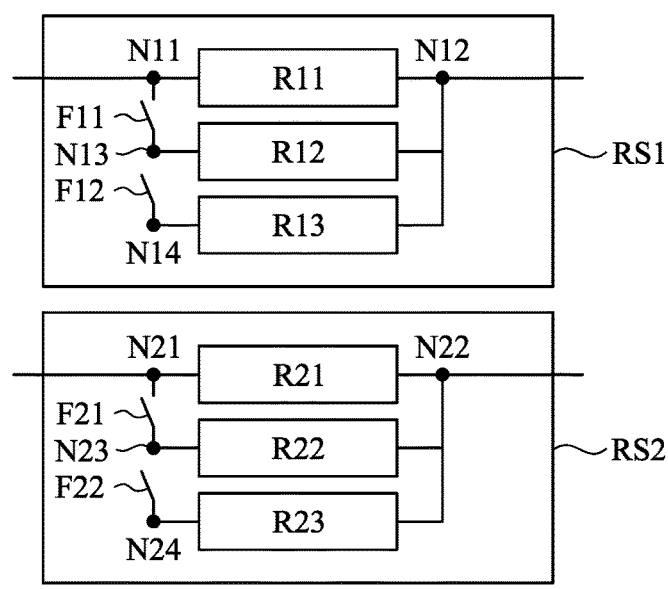
FIG. 4 is a schematic diagram of a resistor circuit illustrated according to some embodiments of this disclosure.

FIG. 4 is a schematic diagram of a resistor circuit 400 illustrated according to some embodiments of this disclosure. Compared with the resistor circuit 200 in FIG. 2, the resistor circuit 400 in FIG. 4 further includes a resistor R13 and a fuse F12 in the resistor set RS1, and a resistor R23 and a fuse F22 in the resistor set RS2.

As illustratively shown in FIG. 4, a terminal of the resistor R13 is coupled to the node N14, another terminal of the resistor R13 is coupled to the node N12. A terminal of the fuse F12 is coupled to the node N14. A terminal of the resistor R23 is coupled to the node N24, another terminal of the resistor R23 is coupled to the node N22. A terminal of the fuse F22 is coupled to the node N24.

In some embodiments, the resistors R11-R13 are coupled in parallel through coupling the node N11 and another terminal of the fuse F11, and coupling the node N13 and another terminal of the fuse F12. The resistors R21-R23 are coupled in parallel through coupling the node N21 and another terminal of the fuse F21, and coupling the node N23 and another terminal of the fuse F22.

Referring to FIG. 1, FIG. 2 and FIG. 4, the resistor circuit 400 is an embodiment of the resistor circuit 200. In some embodiments, some or all of the resistors R11-R13 and R21-R23 are coupled in parallel respectively according to the impedance value ZL of the impedance RL in the redistribution layer 130.

In some embodiments, each of the resistors in the resistor circuit 120, such as each of the resistors R11-R71, R12-R72, R13 and R23, is referred to as an on-die terminal (ODT) resistor. In some embodiments, each of the resistors in the resistor circuit 120 is implemented as a variable resistor. In some embodiments, each of the resistors in the resistor circuit 120 has an impedance value RZQ. In some embodiments, the impedance value RZQ is about 240 ohms.

In some embodiments, each of the fuses in the resistor circuit 120, such as each of the fuses F11-F71, F12 and F22, is reusable. In some embodiments, each of the fuses in the resistor circuit 120 is implemented as transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, and planar MOS transistors with raised sources/drains. In some embodiments, each of the fuses in the resistor circuit 120 is coupled to or decoupled to each of the nodes in the resistor circuit 120, such as the nodes N11-N71, N13-N73, N14 and N24 according to the voltage level applied to each of the fuses in the resistor circuit 120. For example in FIG. 2, the fuse F11 is coupled to node N11 when applied to a high voltage level, such as 2.5 V, and is decoupled to node N11 when applied to a low voltage level, such as 0 V.

Figure 5:
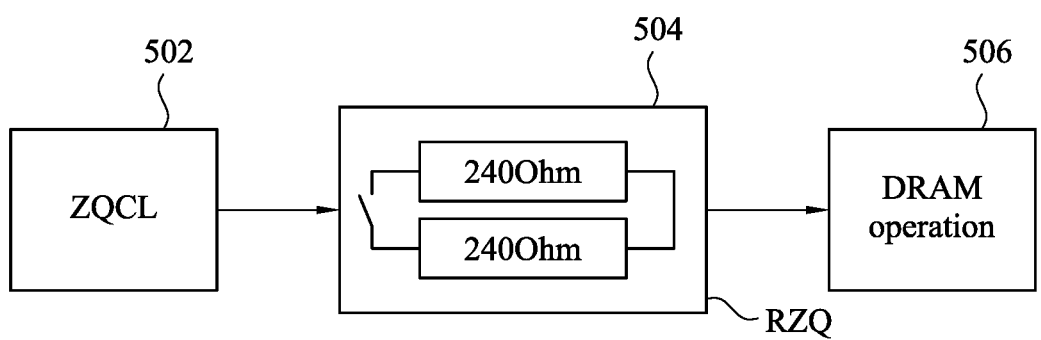
FIG. 5 is a flowchart of a method for operating a memory device in FIG. 1 according to some embodiments of this disclosure.

FIG. 5 is a flowchart of a method 500 for operating the memory device 100 in FIG. 1 according to some embodiments of this disclosure. In FIG. 5, method 500 includes operations 502, 504 and 506.

At operation 502, a ZQ calibration long (ZQCL) command is performed, and the impedance value RZQ of each of the resistors in the resistor circuit 120, such as each of the resistors R11-R71, R12-R72, R13 and R23 in FIG. 2 to FIG. 4, is reset to an impedance value, such as 240 ohms. In some embodiments, the ZQCL command is configured to calibrate the DRAM drive strength and termination values. In some embodiments, the ZQCL command typically completes in five hundred twelve (512) DRAM clock cycles. In some embodiments, the memory circuit 110 is suspended and not allowed to perform other operations for one thousand twenty-four (1024) DRAM clock cycles after the operation 502 is completed.

At operation 504, one or more resistors in each of the resistor sets of the resistor circuit 120, such as the resistors R11 and R12 in the resistor set RS1, the resistors R21 and R22 in the resistor set RS2 in FIG. 2, the resistors in the resistor sets RS1-RS7 in FIG. 3, the resistors in the resistor sets RS1-RS2 in FIG. 4, are coupled in parallel according to the impedance value ZL of the redistribution layer 130. In some embodiments, the impedance value ZR is equal to or less than a difference between the impedance value RZQ and the impedance value ZL.

For example, when the impedance value ZL is RZQ/2, the impedance value ZR is equal to or less than RZQ/2. Accordingly, the resistors R11 and R12 are coupled in parallel, the resistors R21 and R22 are coupled in parallel, the resistors R31 and R32 are coupled in parallel, the resistors R41 and R42 are coupled in parallel, the resistors R51 and R52 are coupled in parallel, the resistors R61 and R62 are coupled in parallel, and the resistors R71 and R72 are coupled in parallel.

For example, when the impedance value ZL is RZQ*2/3, the impedance value ZR is equal to or less than RZQ/3. Accordingly, the resistors R11-R13 are coupled in parallel, the resistors R21-R23 are coupled in parallel.

At operation 506, the memory circuit 110 performs general operations, such as operations OP1-OP7. In some embodiments, operations OP1-OP7 (not shown) correspond to various operations operated in the memory circuit 110, and correspond to different impedance values of the memory circuit 110, such as the impedance value ZR of the resistor circuit 120. Accordingly, the resistor circuit 120 adjusts the impedance value ZR by coupling one or more of the resistor sets RS1-RSn in parallel.

For example, when the memory circuit 110 performs the operation OP1, the impedance value of the memory circuit 110 corresponds to the impedance value RZQ. Accordingly, the resistor circuit 120 adjusts the impedance value ZR by coupling the resistor set RS1. When the memory circuit 110 performs the operation OP2, the impedance value of the memory circuit 110 corresponds to the impedance value RZQ/2. Accordingly, the resistor circuit 120 adjusts the impedance value ZR by coupling the resistor sets RS1 and RS2. When the memory circuit 110 performs the operation OP3, the impedance value of the memory circuit 110 corresponds to the impedance value RZQ/3. Accordingly, the resistor circuit 120 adjusts the impedance value ZR by coupling the resistor sets RS1-RS3. When the memory circuit 110 performs the operation OP4, the impedance value of the memory circuit 110 corresponds to the impedance value RZQ/4. Accordingly, the resistor circuit 120 adjusts the impedance value ZR by coupling the resistor sets RS1-RS4. When the memory circuit 110 performs the operation OP5, the impedance value of the memory circuit 110 corresponds to the impedance value RZQ/5. Accordingly, the resistor circuit 120 adjusts the impedance value ZR by coupling the resistor sets RS1-RS5. When the memory circuit 110 performs the operation OP6, the impedance value of the memory circuit 110 corresponds to the impedance value RZQ/6. Accordingly, the resistor circuit 120 adjusts the impedance value ZR by coupling the resistor sets RS1-RS6. When the memory circuit 110 performs the operation OP7, the impedance value of the memory circuit 110 corresponds to the impedance value RZQ/7. Accordingly, the resistor circuit 120 adjusts the impedance value ZR by coupling the resistor sets RS1-RS7.

Figure 6:
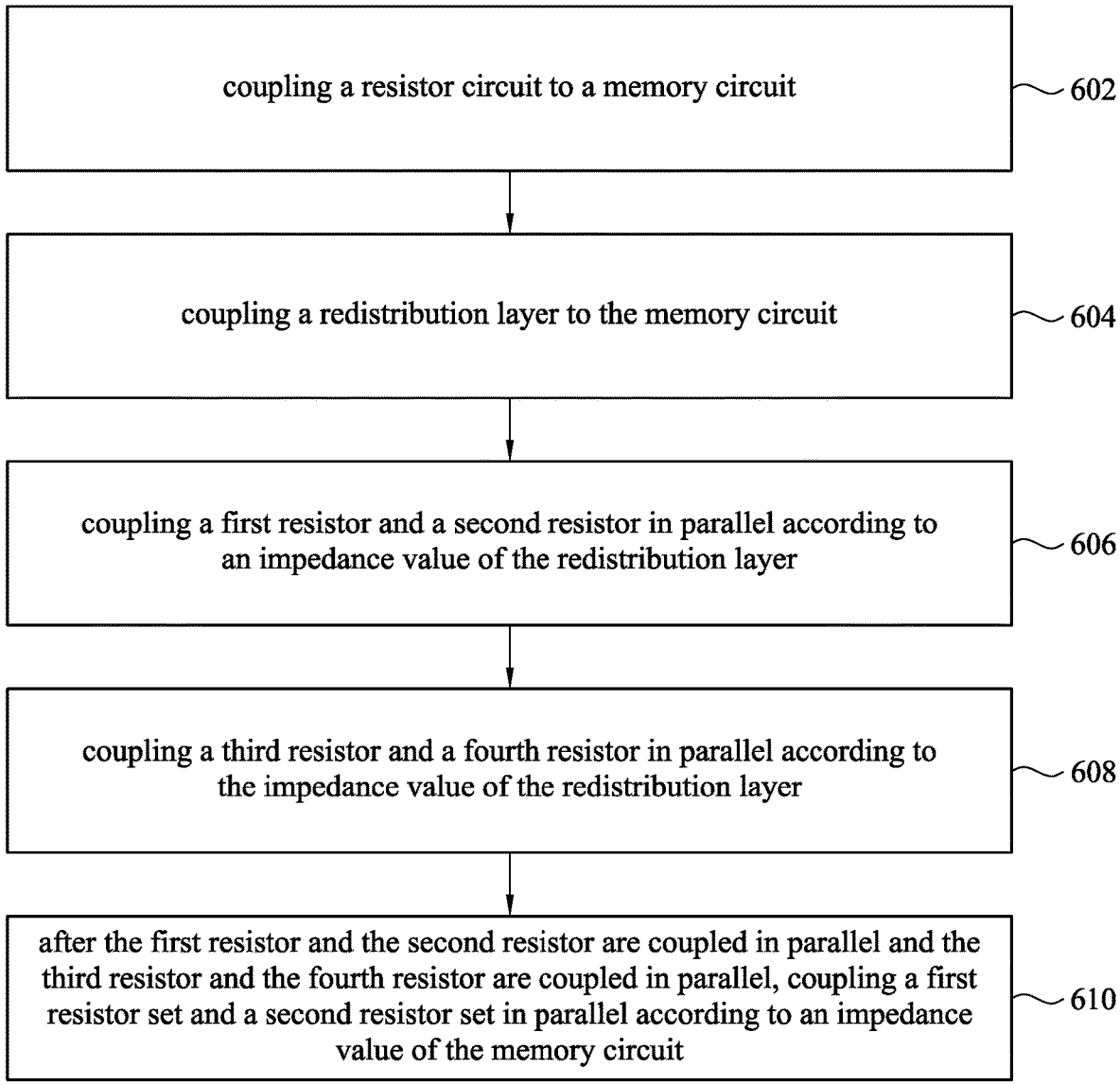
FIG. 6 is a flowchart of a method for operating a memory device in FIG. 1 according to some embodiments of this disclosure.

FIG. 6 is a flowchart of a method 600 for operating a memory device 100 in FIG. 1 according to some embodiments of this disclosure. In FIG. 6, method 600 includes operations 602, 604, 606, 608 and 610.

At operation 602, the resistor circuit 120 is coupled to the memory circuit 110.

At operation 604, the redistribution layer 130 is coupled to the memory circuit 110.

At operation 606, the resistors R11 and R12 are coupled in parallel according to the impedance value ZL of the redistribution layer 130.

At operation 608, the resistors R21 and R22 are coupled in parallel according to the impedance value ZL of the redistribution layer 130.

At operation 610, after the resistors R11 and R12 are coupled in parallel and the resistors R21 and R22 are coupled in parallel, the resistor set RS1 and the resistor set RS2 are coupled in parallel according to the impedance value of the memory circuit 110.

In some approaches, when integrated circuits (ICs) are applied to various component modules, redistribution layers (RDLs) are coupled to/formed in the ICs to change contact locations of the ICs, such that additional lines of the RDL increase impedance of the ICs, such as a DRAM. As a result, the signal integrity (SI) of signals written into the DRAM is affected.

Compared to the above approaches, in some embodiments of the present disclosure, when the operation 504 is performed, one or more resistors in each of the resistor sets of the resistor circuit 120 are coupled in parallel according to the impedance value ZL of the redistribution layer 130, such that the impedance value ZR of the memory circuit 110 is equal to or less than the difference between the impedance value RZQ and the impedance value ZL of the redistribution layer 130. As a result, the signal integrity (SI) of signals written into the memory device 100 is not affected.

In summary, in the embodiments of the present disclosure, the resistor circuit 120 increases the impedance of the memory circuit 110 when the memory circuit 110 is coupled to the redistribution layer 130, to maintain the signal integrity (SI) of signals written into the memory device 100.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory device, comprising:
   a memory circuit;
   a redistribution layer coupled to the memory circuit; and
   a resistor circuit coupled to the memory circuit and comprising a first resistor set and a second resistor set,
   wherein the first resistor set comprises a first resistor and a second resistor,
   the second resistor set comprises a third resistor and a fourth resistor, and
   after the first resistor and the second resistor are coupled in parallel and the third resistor and the fourth resistor are coupled in parallel according to an impedance value of the redistribution layer, the first resistor set and the second resistor set are coupled in parallel according to an impedance value of the memory circuit.

2. The memory device of claim 1, wherein
   the resistor circuit further comprises a third resistor set,
   the third resistor set comprises a fifth resistor and a sixth resistor,
   the fifth resistor and the sixth resistor are coupled in parallel according to the impedance value of the redistribution layer, and
   the first resistor set, the second resistor set and the third resistor set are coupled in parallel according to the impedance value of the memory circuit.

3. The memory device of claim 2, wherein
   the resistor circuit further comprises a fourth resistor set,
   the fourth resistor set comprises a seventh resistor and an eighth resistor,
   the seventh resistor and the eighth resistor are coupled in parallel according to the impedance value of the redistribution layer, and the first resistor set, the second resistor set, the third resistor set and the fourth resistor set are coupled in parallel according to the impedance value of the memory circuit.

4. The memory device of claim 3, wherein
the resistor circuit further comprises a fifth resistor set,
the fifth resistor set comprises a ninth resistor and a tenth resistor,
the ninth resistor and the tenth resistor are coupled in parallel according to the impedance value of the redistribution layer, and
the first resistor set, the second resistor set, the third resistor set, the fourth resistor set and the fifth resistor set are coupled in parallel according to the impedance value of the memory circuit.

5. The memory device of claim 4, wherein
the resistor circuit further comprises a sixth resistor set,
the sixth resistor set comprises a eleventh resistor and a twelfth resistor,
the eleventh resistor and the twelfth resistor are coupled in parallel according to the impedance value of the redistribution layer, and
the first resistor set, the second resistor set, the third resistor set, the fourth resistor set, the fifth resistor set and the sixth resistor set are coupled in parallel according to the impedance value of the memory circuit.

6. The memory device of claim 5, wherein
the resistor circuit further comprises a seventh resistor set,
the seventh resistor set comprises a thirteenth resistor and a fourteenth resistor,
the thirteenth resistor and the fourteenth resistor are coupled in parallel according to the impedance value of the redistribution layer, and
the first resistor set, the second resistor set, the third resistor set, the fourth resistor set, the fifth resistor set, the sixth resistor set and the seventh resistor set are coupled in parallel according to the impedance value of the memory circuit.

7. The memory device of claim 1, wherein
the first resistor set further comprises a fifth resistor,
the second resistor set further comprises a sixth resistor, and
the first resistor, the second resistor and the fifth resistor are coupled in parallel and the third resistor, the fourth resistor and the sixth resistor are coupled in parallel according to the impedance value of the redistribution layer.

8. A memory device, comprising:
a memory circuit;
a redistribution layer coupled to the memory circuit; and
a resistor circuit coupled to the memory circuit and comprising a first resistor set and a second resistor set,
wherein the first resistor set comprises a first resistor, a second resistor and a first fuse coupled to the second resistor,
the second resistor set comprises a third resistor, a fourth resistor and a second fuse coupled to the fourth resistor, and
after the first resistor and the second resistor are coupled in parallel through the first fuse and the third resistor and the fourth resistor are coupled in parallel through the second fuse according to an impedance value of the redistribution layer, the first resistor set and the second resistor set are coupled in parallel according to an impedance value of the memory circuit.

9. The memory device of claim 8, wherein
the resistor circuit further comprises a third resistor set,
the third resistor set comprises a fifth resistor, a sixth resistor and a third fuse coupled to the sixth resistor,
the fifth resistor and the sixth resistor are coupled in parallel through the third fuse according to the impedance value of the redistribution layer, and
the first resistor set, the second resistor set and the third resistor set are coupled in parallel according to the impedance value of the memory circuit.

10. The memory device of claim 9, wherein
the resistor circuit further comprises a fourth resistor set,
the fourth resistor set comprises a seventh resistor, an eighth resistor and a fourth fuse coupled to the eighth resistor,
the seventh resistor and the eighth resistor are coupled in parallel through the fourth fuse according to the impedance value of the redistribution layer, and
the first resistor set, the second resistor set, the third resistor set and the fourth resistor set are coupled in parallel according to the impedance value of the memory circuit.

11. The memory device of claim 10, wherein
the resistor circuit further comprises a fifth resistor set,
the fifth resistor set comprises a ninth resistor, a tenth resistor and a fifth fuse coupled to the tenth resistor,
the ninth resistor and the tenth resistor are coupled in parallel through the fifth fuse according to the impedance value of the redistribution layer, and
the first resistor set, the second resistor set, the third resistor set, the fourth resistor set and the fifth resistor set are coupled in parallel according to the impedance value of the memory circuit.

12. The memory device of claim 11, wherein
the resistor circuit further comprises a sixth resistor set,
the sixth resistor set comprises a eleventh resistor, a twelfth resistor and a sixth fuse coupled to the twelfth resistor,
the eleventh resistor and the twelfth resistor are coupled in parallel through the sixth fuse according to the impedance value of the redistribution layer, and
the first resistor set, the second resistor set, the third resistor set, the fourth resistor set, the fifth resistor set and the sixth resistor set are coupled in parallel according to the impedance value of the memory circuit.

13. The memory device of claim 12, wherein
the resistor circuit further comprises a seventh resistor set,
the seventh resistor set comprises a thirteenth resistor, a fourteenth resistor and a seventh fuse coupled to the fourteenth resistor,
the thirteenth resistor and the fourteenth resistor are coupled in parallel through the seventh fuse according to the impedance value of the redistribution layer, and
the first resistor set, the second resistor set, the third resistor set, the fourth resistor set, the fifth resistor set, the sixth resistor set and the seventh resistor set are coupled in parallel according to the impedance value of the memory circuit.

14. The memory device of claim 8, wherein
the first resistor set further comprises a fifth resistor and a third fuse coupled to the fifth resistor,
the second resistor set further comprises a sixth resistor and a fourth fuse coupled to the sixth resistor, and
the first resistor, the second resistor and the fifth resistor are coupled in parallel through the first fuse and the third fuse, and the third resistor, the fourth resistor and the sixth resistor are coupled in parallel through the second fuse and the fourth fuse according to the impedance value of the redistribution layer.

15. A method for operating a memory device, comprising:
coupling a resistor circuit to a memory circuit;
coupling a redistribution layer to the memory circuit;
coupling a first resistor and a second resistor in parallel according to an impedance value of the redistribution layer;
coupling a third resistor and a fourth resistor in parallel according to the impedance value of the redistribution layer; and
after the first resistor and the second resistor are coupled in parallel and the third resistor and the fourth resistor are coupled in parallel, coupling a first resistor set and a second resistor set in parallel according to an impedance value of the memory circuit.

16. The method of claim 15, wherein
the resistor circuit comprises the first resistor set and the second resistor set,
the first resistor set comprises the first resistor and the second resistor, and
the second resistor set comprises the third resistor and the fourth resistor.

17. The method of claim 16, further comprising:
coupling a fifth resistor and a sixth resistor in parallel according to the impedance value of the redistribution layer; and
after the first resistor and the second resistor are coupled in parallel, the third resistor and the fourth resistor are coupled in parallel, and the fifth resistor and the sixth resistor are coupled in parallel, coupling a third resistor set, the first resistor set and the second resistor set in parallel according to the impedance value of the memory circuit.

18. The method of claim 17, wherein
the resistor circuit further comprises the third resistor set, and
the third resistor set comprises the fifth resistor and the sixth resistor.

19. The method of claim 16, further comprising:
coupling a fifth resistor, the first resistor and the second resistor in parallel according to the impedance value of the redistribution layer;
coupling a sixth resistor, the third resistor and the fourth resistor in parallel according to the impedance value of the redistribution layer; and
after the fifth resistor, the first resistor and the second resistor are coupled in parallel and the sixth resistor, the third resistor and the fourth resistor are coupled in parallel, coupling the first resistor set and the second resistor set in parallel according to the impedance value of the memory circuit,
wherein the first resistor set further comprises the fifth resistor, and
the second resistor set further comprises the sixth resistor.

20. The method of claim 16, further comprising:
coupling a first fuse to the second resistor; and
coupling a second fuse to the fourth resistor, wherein
the first resistor and the second resistor are coupled in parallel through the first fuse, and
the third resistor and the fourth resistor are coupled in parallel through the second fuse.

* * * * *